US 9,217,611 B2

(12) United States Patent
Chen et al.

(10) Patent No.: US 9,217,611 B2
(45) Date of Patent: Dec. 22, 2015

(54) AIR DUCT AND HEAT DISSIPATION DEVICE HAVING THE SAME

(71) Applicant: ShenZhen Treasure City Technology Co., LTD., ShenZhen (CN)

(72) Inventors: Ching-Jou Chen, New Taipei (TW); Wen-Chieh Wang, New Taipei (TW); Chih-Sheng Hsieh, New Taipei (TW); Pei-Chun Ko, New Taipei (TW); Gin-Zen Ting, New Taipei (TW); Wei-De Wang, New Taipei (TW); Chung-Jen Hung, New Taipei (TW)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 558 days.

(21) Appl. No.: 13/720,782

(22) Filed: Dec. 19, 2012

(65) Prior Publication Data

US 2014/0166247 A1    Jun. 19, 2014

(30) Foreign Application Priority Data

Dec. 14, 2012    (TW) .................................. 101147429

(51) Int. Cl.
  *F28F 13/06*    (2006.01)
  *H01L 23/467*    (2006.01)
  *H05K 7/20*    (2006.01)
  *F04D 29/52*    (2006.01)

(52) U.S. Cl.
  CPC .............. *F28F 13/06* (2013.01); *F04D 29/522* (2013.01); *H01L 23/467* (2013.01); *H05K 7/20145* (2013.01); *H05K 7/20172* (2013.01); *H01L 2924/0002* (2013.01)

(58) Field of Classification Search
  CPC . F28F 13/06; H05K 7/20145; H05K 7/20172; H01L 23/467; H01L 23/4093; F04D 29/522
  USPC ................................................ 361/694–697
  See application file for complete search history.

(56) References Cited

U.S. PATENT DOCUMENTS

| 5,590,025 | A  | * | 12/1996 | Clemens | ............. | H01L 23/4093 |
| | | | | | | 165/185 |
| 5,677,829 | A  | * | 10/1997 | Clemens | ............. | H01L 23/4093 |
| | | | | | | 165/185 |
| 6,311,766 | B1 | * | 11/2001 | Lin | ........................ | H01L 23/467 |
| | | | | | | 165/121 |
| 6,401,806 | B1 | * | 6/2002 | Lee | ..................... | H01L 23/4093 |
| | | | | | | 165/121 |
| 6,520,250 | B2 | * | 2/2003 | Lee | ........................ | H01L 23/467 |
| | | | | | | 165/121 |
| 6,538,888 | B1 | * | 3/2003 | Wei | ........................ | H01L 23/467 |
| | | | | | | 165/121 |
| 6,672,374 | B1 | * | 1/2004 | Lin | ..................... | H01L 23/4093 |
| | | | | | | 165/121 |
| 7,131,485 | B2 | * | 11/2006 | Yu | ........................ | H01L 23/467 |
| | | | | | | 165/185 |
| 7,281,893 | B2 | * | 10/2007 | Pan | ....................... | F04D 29/601 |
| | | | | | | 165/80.3 |
| 7,545,643 | B2 | * | 6/2009 | Li | ........................ | H01L 23/467 |
| | | | | | | 165/80.3 |
| 8,069,908 | B2 | * | 12/2011 | Chen | ..................... | H01L 23/467 |
| | | | | | | 165/121 |
| 8,248,794 | B2 | * | 8/2012 | Li | ....................... | H01L 23/4006 |
| | | | | | | 361/691 |
| 8,505,615 | B2 | * | 8/2013 | Lin | ..................... | F28D 15/0275 |
| | | | | | | 165/121 |

(Continued)

*Primary Examiner* — Ninh H Nguyen
*Assistant Examiner* — Christopher R Legendre
(74) *Attorney, Agent, or Firm* — Novak Druce Connolly Bove + Quigg LLP

(57) ABSTRACT

An air duct mounted to a fan having an end board includes a top board which defines an opening, through which the fan is extended. Two opposite blocking members extend up from the top board at opposite first sides of the opening. Two opposite limiting members extend up from the top board at opposite second sides of the opening. Each blocking member includes a tab to block a top of the end board of the fan. Each limiting member includes a projection to abut a bottom of the end board of the fan.

9 Claims, 3 Drawing Sheets

(56) References Cited

U.S. PATENT DOCUMENTS

| | | | |
|---|---|---|---|
| 2004/0194927 A1* | 10/2004 | Lee | H01L 23/467 165/80.3 |
| 2007/0119567 A1* | 5/2007 | Yeh | H01L 23/467 165/80.3 |
| 2010/0061060 A1* | 3/2010 | Tien | H01L 23/4006 361/697 |
| 2012/0188716 A1* | 7/2012 | Wang | G06F 1/20 361/697 |
| 2014/0166247 A1* | 6/2014 | Chen | F04D 29/522 165/122 |

* cited by examiner

AIR DUCT AND HEAT DISSIPATION DEVICE HAVING THE SAME

BACKGROUND

1. Technical Field

The present disclosure relates to a heat dissipation device including an air duct.

2. Description of Related Art

Many air ducts are often mounted to heat sinks by screws, which is time-consuming.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
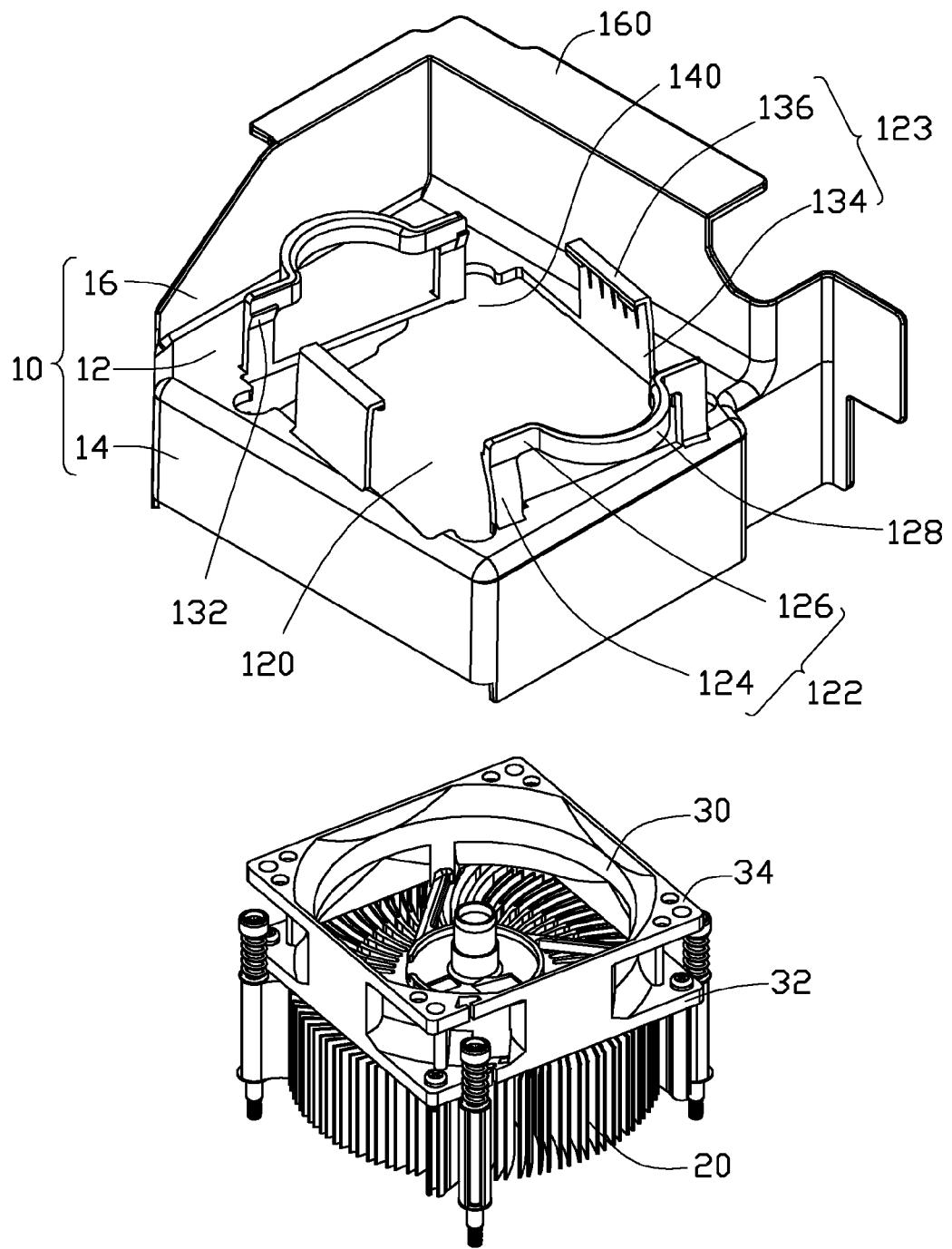
FIG. 1 is an exploded, isometric view of an exemplary embodiment of an air duct, together with a fan and a heat sink.

FIG. 1 shows an exemplary embodiment of a heat dissipation device includes an air duct 10, a fan 30, and a heat sink 20.

The air duct 10 includes a rectangular top board 12, a sidewall 14 perpendicularly extending down from four edges of the top board 12, and an extension wall 16 perpendicularly extending up from two adjacent edges of the top board 12. The sidewall 14 defines an outlet 140 adjacent to the extension wall 16. A blocking wall 160 perpendicularly extends out from a top side of the extension wall 16. The sidewall 14 and the extension wall 16 are arranged to guide the airflow of the fan 30.

The top board 12 defines an opening 120 in a center which functions as an inlet of the air duct 10. Two limiting members 122 extend up from the top board 12 at opposite first sides of the opening 120. Two blocking member 123 extend up from the top board 12 at opposite second sides of the opening 120. Each limiting member 122 includes two standing portions 124 perpendicularly connected to the top board 12 and a handle 126 connected between the standing portions 124. A center of the handle 126 concaves away from the opening 120 to form an operation portion 128. A projection 132 protrudes from a top end of each standing portion 124, facing the opening 120. Each blocking member 123 includes a standing piece 134 perpendicularly connected to the top board 12, and a tab 136 perpendicularly extending toward the opening 120 from a top end of the standing piece 134.

The fan 30 includes two opposite end boards 32 and 34. The end board 32 is mounted on a top of the heat sink 20 by screws.

Figure 2:
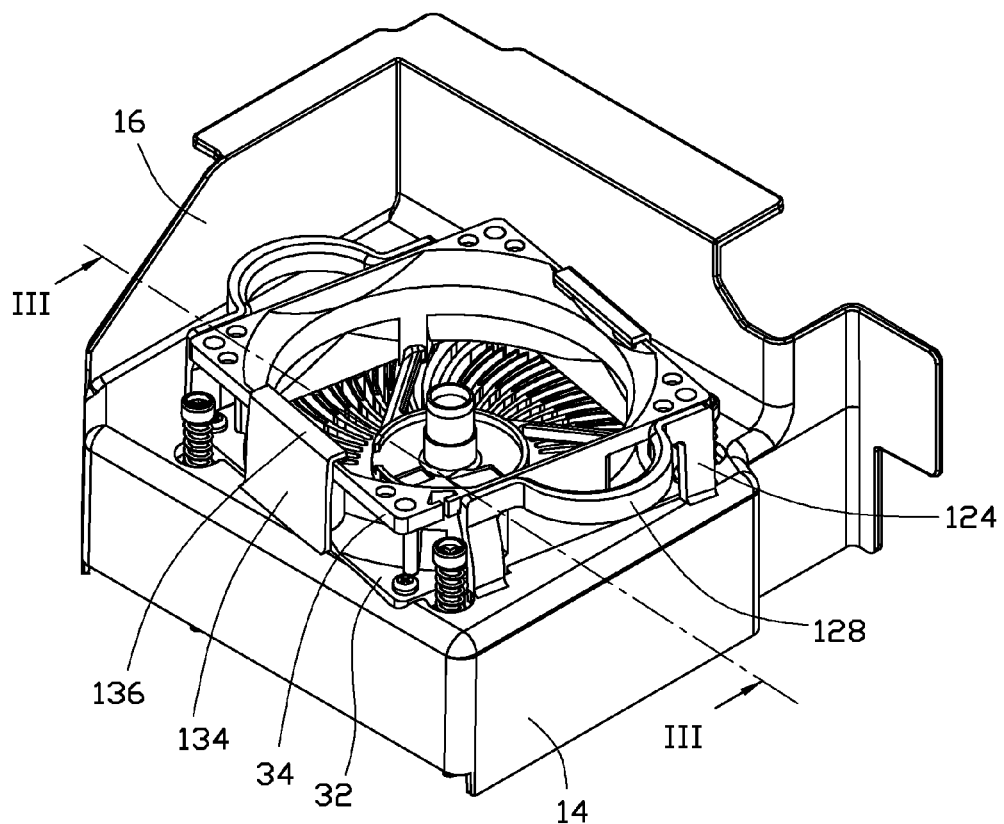
FIG. 2 is an assembled, isometric view of FIG. 1.
Figure 3:
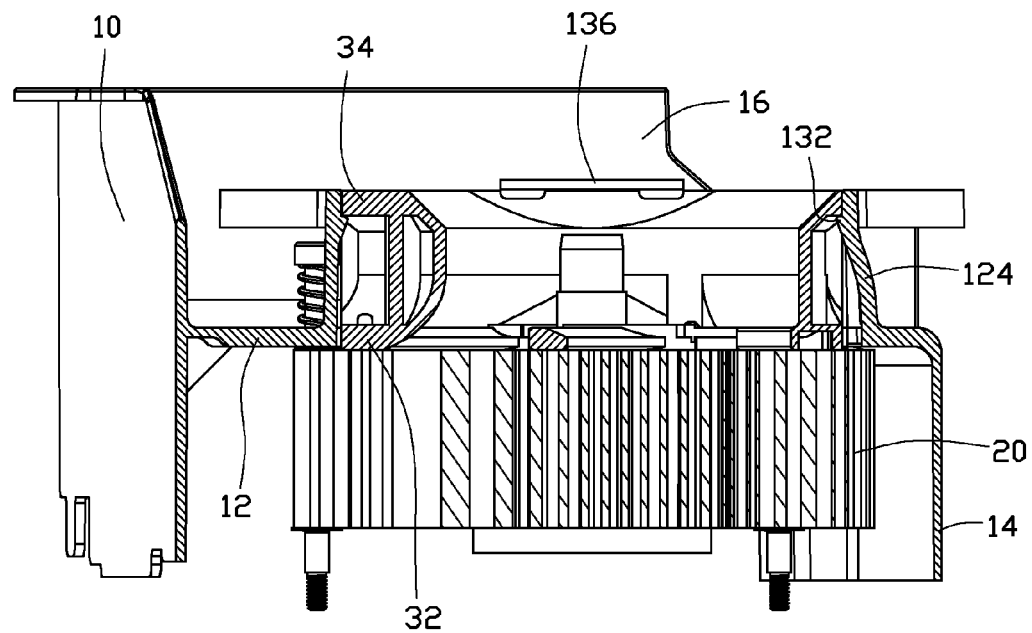
FIG. 3 is a sectional view of FIG. 2, taken along the line III-III.

Referring to FIGS. 2 and 3, in assembly, the operation portions 128 are pulled away from each other to deform the standing portions 124 away from the opening 120. The air duct 10 is then fitted around the fan 30 and the heat sink 20, until the top board 12 contacts the top of the heat sink 20. The fan 30 extends out through the opening 120, until the end board 34 contacts bottoms of the tabs 136. The operation portions 128 are released. The standing portions 124 are restored to bias the projections 134 to abut a bottom of the end board 34 facing the end board 32, thereby detachably mounting the air duct 10 on the heat sink 20. Airflow generated by the fan 20 flows toward the heat sink 20 and then flows out of the air duct 10 through the outlet 140 to heat electronic components. Because of the sidewall 14, the extension wall 16, and the blocking wall 160, hot airflow from the electronic components will not flow into the opening 120.

In disengaging the air duct 10 from the heat sink 20 and the fan 30, the operation portions 128 are pulled away from each other to disengage the projections 132 from the end board 34. Therefore, the air duct 10 is readily taken away from the heat sink 20 and the fan 30.

In another embodiment, the blocking members 123 and the handles 126 can be omitted. Thus, the top board 12 is supported on the heat sink 20, and the projection 132 abuts the bottom of the end board 34 of the fan 30.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A heat dissipation device, comprising:
    a heat sink;
    a fan mounted on a top of the heat sink, and comprising an end board away from the heat sink;
    an air duct comprising a top board abutting the top of the heat sink; the top board defining an opening through which the fan is extended, two limiting members extending up from the top board at opposite first sides of the opening, each limiting member comprising a projection abutting a bottom of the end board of the fan.

2. The heat dissipation device of claim 1, wherein two blocking members extend up from the top board at opposite second sides of the opening; each blocking member comprises a tab to block a top of the end board of the fan.

3. The heat dissipation device of claim 1, wherein each limiting member further comprises a handle extending away from the opening, the projection protrudes from a side of the limiting member facing the opening.

4. The heat dissipation device of claim 3, wherein each limiting member further comprises two standing portions, the handle is connected between the standing portions.

5. An air duct for being mounted to a fan comprising an end board, the air duct comprising:
    a top board defining an opening, two limiting members extending up from the top board at opposite first sides of the opening, two blocking members extending up from the top board at opposite second sides of the opening; each blocking member comprising a tab to block a top of the end board of the fan, each limiting member comprising a projection to abut a bottom of the end board of the fan.

6. The air duct of claim 5, wherein each limiting member further comprises a handle extending away from the opening, the projection protrudes from a side of the limiting member facing the opening.

7. The air duct of claim 6, wherein each limiting member further comprises two standing portions, the handle is connected between the standing portions.

8. The air duct of claim 5, further comprising a sidewall extending down from edges of the top board and an extension wall perpendicularly extending up from parts of the edges of the top board.

9. The air duct of claim 8, wherein a blocking wall perpendicularly extends out from a top side of the extension wall.

* * * * *